United States Patent [19]

Lai

[11] Patent Number: 5,106,772
[45] Date of Patent: Apr. 21, 1992

[54] METHOD FOR IMPROVING THE ELECTRICAL ERASE CHARACTERISTICS OF FLOATING GATE MEMORY CELLS BY IMMEDIATELY DEPOSITING A PROTECTIVE POLYSILICON LAYER FOLLOWING GROWTH OF THE TUNNEL OR GATE OXIDE

[75] Inventor: Stefan K. Lai, Belmont, Calif.

[73] Assignee: Intel Corporation, Santa Clara, Calif.

[21] Appl. No.: 462,709

[22] Filed: Jan. 9, 1990

[51] Int. Cl.$^5$ .................. H01L 21/76; H01L 21/265
[52] U.S. Cl. .......................... 437/43; 437/49; 437/69; 437/193
[58] Field of Search .............. 437/43, 49, 52, 193, 437/195, 69, 70

[56] References Cited

U.S. PATENT DOCUMENTS

| 3,984,822 | 10/1976 | Simko et al. | 437/43 |
|---|---|---|---|
| 4,114,255 | 9/1978 | Salsbury et al. | 437/43 |
| 4,178,674 | 3/1978 | Liu et al. | 437/52 |
| 4,407,696 | 10/1983 | Han et al. | 437/69 |
| 4,413,403 | 11/1983 | Ariizumi | 437/69 |
| 4,698,787 | 10/1987 | Mukherjee et al. | 357/23.5 |
| 4,780,424 | 10/1988 | Holler et al. | 437/43 |
| 4,816,883 | 3/1989 | Baldi | 357/23.5 |
| 4,872,041 | 10/1989 | Sugiura | 357/23.5 |
| 5,002,898 | 3/1991 | Fritzinger et al. | 437/69 |
| 5,010,028 | 4/1991 | Gill et al. | 437/43 |

FOREIGN PATENT DOCUMENTS

| 0002997 | 7/1979 | European Pat. Off. |
| 0056195 | 7/1982 | European Pat. Off. |
| 0274390 | 7/1988 | European Pat. Off. |
| 0280276 | 8/1988 | European Pat. Off. |
| 0074350 | 4/1986 | Japan |
| 0137457 | 6/1988 | Japan | 437/70 |
| 1445450 | 8/1976 | United Kingdom |
| 1536321 | 12/1978 | United Kingdom |
| 1552729 | 9/1979 | United Kingdom |
| 1575960 | 10/1980 | United Kingdom |

OTHER PUBLICATIONS

*Isolation Process using Polysilicon Buffer Layer for Scaled MOS/VLSI,* Y. Han, B. Ma Ext. Abstract 84–I, Journal of the Elec. Society, p. 98, 1974.
Hashi et al., "An improved LOCOS Technology using thin oxide and polysilicon buffer layers", J. of the Electrochemical Society of Japan, vol. 98, pp. 78–83, 1984.
Han et al., "Isolation process using polysilicon buffer layer for scaled MOS/VLSI", Proceedings VLSI science and technology, vol. 84-7, pp. 334–339, 1984.

*Primary Examiner*—Brian E. Hearn
*Assistant Examiner*—C. Chaudhari

[57] ABSTRACT

A method for fabricating floating gate memory arrays with improved electrical erase characteristics and a reduced gate oxide defect density is described. According to the invented method, a protective polysilicon layer is deposited immediately following growth of the tunnel or gate oxide. The polysilicon layer caps the gate oxide—protecting it from exposure to defect-causing contaminants and to insure that a uniform tunnel oxide thickness is maintained across the entire length of the channel; especially over the electron tunneling regions. Following application of the protective polysilicon layer, a second polysilicon layer is deposited and merges with the first polysilicon layer to form the floating gate for the device. Erase speed is improved for flash EEPROM devices fabricated according to the present invention by about 5–100 times.

32 Claims, 2 Drawing Sheets

FIG_1 (PRIOR ART)
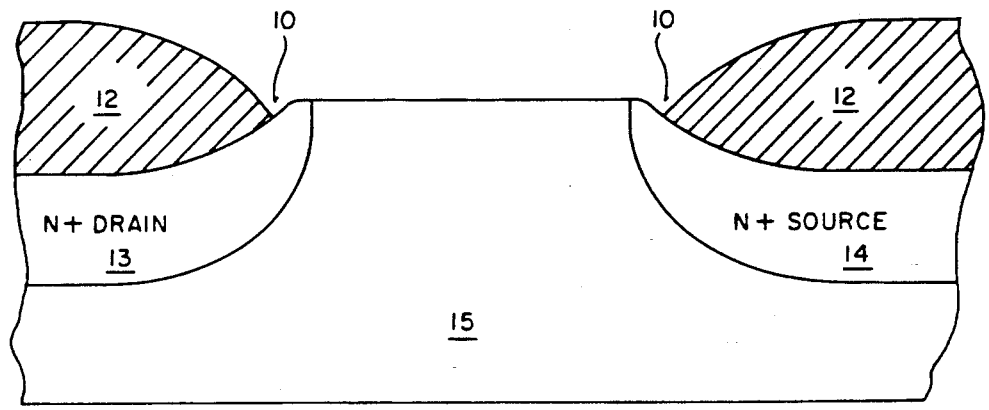
FIG_2
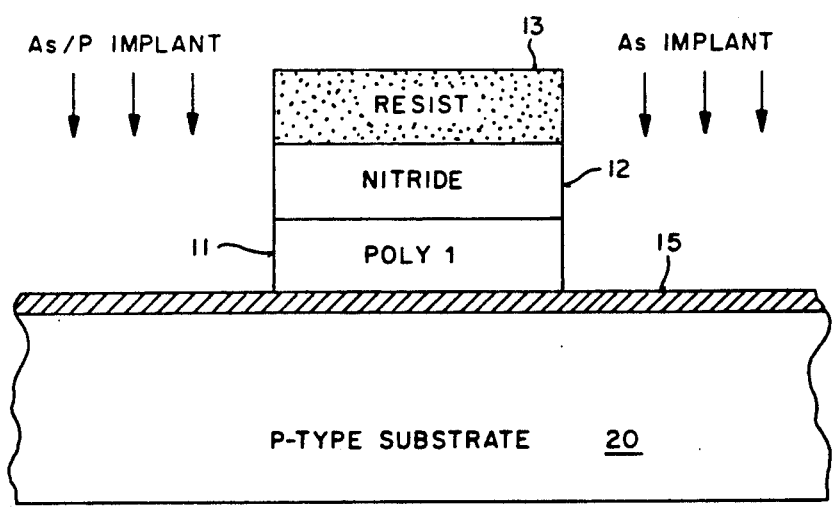

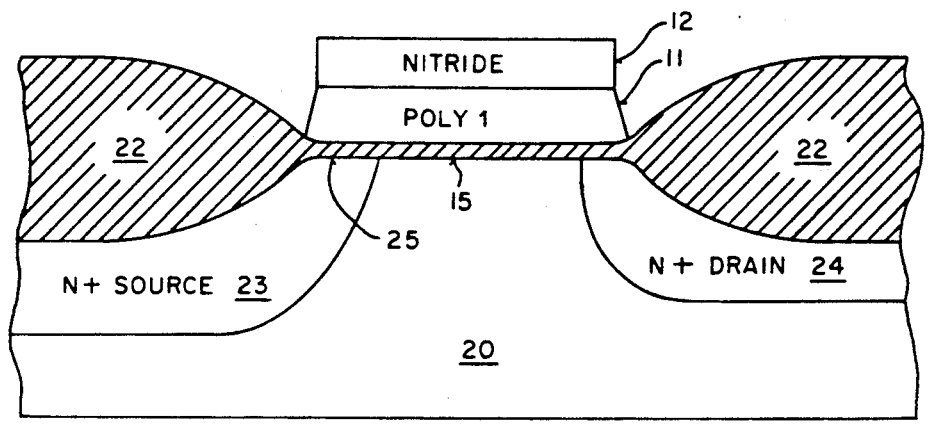
FIG_3
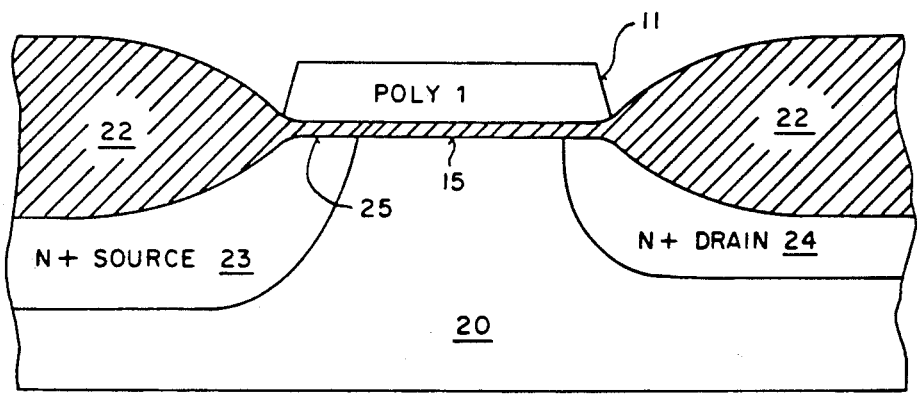
FIG_4
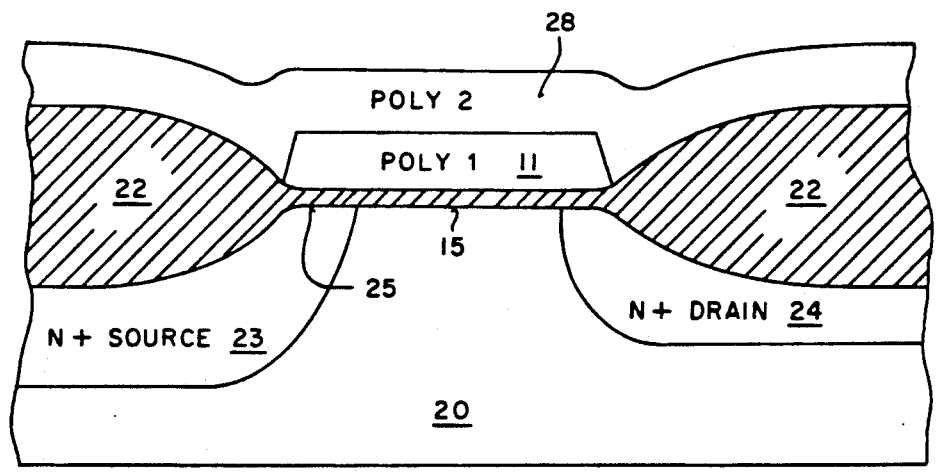
FIG_5

METHOD FOR IMPROVING THE ELECTRICAL ERASE CHARACTERISTICS OF FLOATING GATE MEMORY CELLS BY IMMEDIATELY DEPOSITING A PROTECTIVE POLYSILICON LAYER FOLLOWING GROWTH OF THE TUNNEL OR GATE OXIDE

FIELD OF THE INVENTION

The present invention relates to the field of the fabrication of semiconductor memory devices employing floating gates; and particularly to methods of improving their associated erase characteristics.

BACKGROUND OF THE INVENTION

Non-volatile semiconductor memory cells employing floating gates which are completely surrounded by an insulative layer such as silicon dioxide are well-known in the prior art. Typically, a polycrystalline silicon (polysilicon) layer is used to form the floating gates. Charge is transferred to the floating gates through a variety of mechanisms such as avalanche injection, channel injection, tunnelling, etc.

The charge on the floating gate affects the surface channel conductivity in the cell. If the conductivity is above a certain level, the cell is deemed to be programmed in one binary state, and if the conductivity is below another level it is deemed to be programmed in the opposite binary state. These cells take a variety of forms in the prior art, some being both electrically erasable and electrically programmable, and others requiring, for example, ultraviolet light for erasing. The cells are incorporated into memories referred to in the prior art as EPROMs, EEPROMs, flash EPROMs and flash EEPROMs. (The term "flash" refers to those memory arrays in which all of the cells may be erased in a single operation).

In general, an EPROM or an EEPROM comprises a silicon substrate including source and drain regions which define a channel therebetween. Disposed above the channel is a polysilicon floating gate. The floating gate is separated from the substrate by a relatively thin gate insulative layer. A control gate is disposed above, and insulated from, the floating gate. The control gate is also commonly fabricated of polysilicon.

In the case of a flash EEPROM cell, electrons (i.e., charge) are stored on the floating gate in a capacitive manner. An example of a flash EEPROM or flash EPROM device is disclosed in co-pending application Ser. No. 07/253,775, filed Oct. 5, 1988, entitled, "Low Voltage EEPROM Cell" which application is assigned to the assignee of the present invention. The devices described in this co-pending application use asymmetrical source/drain regions and rely on the mechanism of Fowler-Nordheim tunnelling of electrons between the source and floating gate during erasing operations.

Recently, much attention has been focused on contactless, electrically programmable and electrically erasable memory cell arrays of the flash EEPROM variety. In the contactless array, cells employ elongated source/drain regions disposed beneath self-aligned thick oxide (SATO) regions. In certain instances, the drain regions are shallow compared to the source regions, while the source regions have more graded junctions. The floating gates are formed over a tunnel oxide disposed between the source and drain regions. Word lines are generally disposed perpendicular to the source and drain regions.

These arrays are sometimes referred to as having "buried bit lines" or using "contactless cells" and requiring virtual ground circuitry for sensing and programming. An example of this type of array and a process for fabricating the same is disclosed in U.S. Pat. No. 4,780,424, which application is assigned to the assignee of the present invention and which is herein incorporated by reference.

One major problem associated with the contactless array of the above-mentioned patent is diminished erase performance. The cause of the slow electrical erase performance is believed to result from an excessively thick tunnel oxide in the region near the source edge. As will be described in more detail, this thickening is inherent in the processing steps of the prior fabrication method.

Erase performance may also be degraded by defect-causing contaminants which react with the gate insulative layer. Often the gate insulative is left exposed during subsequent processing steps (e.g., etching, implantation, nitridation, etc.) This exposure frequently leads to submicroscopic defects in the tunnel oxide which greatly weaken the insulator's breakdown characteristics and electrical reliability. In other instances, the tunnel oxide is grown on a portion of the silicon substrate which has undergone significant amounts of processing, thereby affecting the quality of the oxide layer.

As will be seen, the present invention provides an improved method by which the gate insulative layer is carefully protected to control variations in thickness thereby providing improved erase performance. The invented method also results in a substantially lowered defect density in the gate oxide.

Other prior art known to Applicant includes U.S. Pat. No. 4,698,787 of Mukherjee et al., which discloses an electrically erasable programmable memory device which is programmed by hot electron injection onto a floating gate and is erased by Fowler-Nordheim tunnelling to the source region.

SUMMARY OF THE INVENTION

The present invention covers a method for fabricating floating gate memory arrays with improved electrical erase characteristics and a reduced gate oxide defect density. According to one embodiment of the present invention, a protective polysilicon layer is deposited immediately following growth of the tunnel or gate oxide. The polysilicon layer caps the gate oxide to protect it from exposure to defect-causing contaminants present during subsequent processing steps. The protective polysilicon layer also insures that a uniform tunnel oxide thickness is maintained across the entire length of the channel; especially over the electron tunnelling regions.

Following application of the protective polysilicon layer, a second polysilicon layer is deposited to directly cover the first polysilicon layer. This second polysilicon layer merges with the first protective polysilicon layer to form the floating gate for the device.

Among the many advantages provided by the present invention is the fact that the tunnel oxide is grown early in the process on a more planar silicon surface. This eliminates corner notches or other surface incongruities in the substrate regions where tunnel oxide growth occurs. The use of a protective polysilicon layer also reduces interference effects during photolithographic processing. This allows the printing of lines at a much higher optical resolution. By careful control of the thickness of the protective (first) polysilicon layer, a threshold adjusting implant may also be performed directly through this protective layer.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein;

FIG. 1 is a cross-sectional view of a substrate from a prior art floating gate memory device after formation of source/drain regions.

FIG. 2 is a cross-sectional view of a substrate which includes strips of polysilicon covered by silicon nitride. This view also illustrates the ion implantation of arsenic and phosphorous into the source/drain regions.

FIG. 3 illustrates the substrate of FIG. 2 following ion implantation of the source and drain regions and growth of the thick oxide regions.

FIG. 4 illustrates the substrate of FIG. 3 after removal of the silicon nitride layer.

FIG. 5 illustrates the substrate of FIG. 4 after deposition of a second polysilicon layer.

DESCRIPTION OF THE PRIOR ART

According to the process for fabricating conactless flash EPROMs disclosed in U.S. Pat. No. 4,780,424 (hereinafter the '424 patent), buried source lines are formed using arsenic and phosphorous ion implantations. A self-aligned thick oxide (SATO) is then grown on top of the source and drain regions (equivalent to field oxide areas formed in a conventional LOCOS process).

During the SATO process a finite amount of lateral oxidation occurs. This results in a thickening of the oxide underneath the nitride layer, thus forming a "bird's-beak" encroachment into the channel region. Following nitride removal, the silicon dioxide covering the channel region is etched down to the substrate surface. Next, a sacrificial oxide is grown and then immediately removed to reduce nitride-related stress defects (commonly known as "Kooi" defects). This permits the growing of a high-grade tunnel oxide layer over the channel.

The particular problem associated with the growth of the sacrificial oxide process cycle is that after the oxide has been dipped off, a portion of the substrate near the bird's-beak region is exposed at a different crystalline orientation than that of the channel. This condition is shown in the cross-sectional view of FIG. 1 which illustrates source and drain regions 14 and 13, respectively, fabricated in a p-type substrate 15. SATO field oxide regions 12 are shown disposed directly above the implanted source/drain regions. The dimension of these thick oxide regions is generally on the order of 2000 Å thick.

Removal of the sacrificial oxide layer results in notches 10 at the edge of the field oxide regions 12 (i.e., where the bird's-beak was previously formed). Note that notches 10 also expose the underlying source/drain regions and generally expose the silicon surface at a different crystalline orientation as compared to the surface of the channel. Both of these factors cause the subsequent oxidation rate over notches 10 to be significantly greater when compared to the rate over the planar channel region. The consequence is, of course, a thickening of the gate oxide over the source and drain regions; exactly where tunnelling takes place during electrical erase operations. Hence, the enhanced oxidation at notches 10 is largely responsible for the slow electrical erase performance of contactless arrays which rely on growth of a sacrificial oxide layer.

In prior art processes, once the tunnel oxide has finally been grown, a layer of polysilicon is deposited and patterned into elongated, parallel, spaced-apart strips over the channel regions. These polysilicon strips eventually form the floating gates of the memory cells.

DESCRIPTION OF THE PREFERRED EMBODIMENT(S)

A process for fabricating floating gate arrays with improved electrical erase characteristics and a more reliable gate oxide is disclosed. In the following description, numerous specific details are set forth, such as specific conductivity types, thicknesses, materials, etc., in order to provide a thorough understanding of the invention. It will be obvious, however, to one skilled in the art that these specific details need not be used to practice the present invention. In other instances, other well-known structures and processing steps have not been described in particular detail in order to avoid unnecessarily obscuring the present invention.

The memory cells of present invention are fabricated using standard metal-oxide-semiconductor (MOS) processing. The array which contains the cells, in the currently preferred embodiment, is fabricated of n-channel devices.

With reference to FIG. 2, instead of first growing an initial pad oxide layer and then covering it with a layer of silicon nitride as is done conventionally in prior art processes, the tunnel oxide 15 is thermally grown first. In the currently preferred embodiment, tunnel oxide or gate oxide layer 15 is approximately 120 Å thick. Special processing techniques, such as nitridation, may also be used to enhance the quality of the tunnel oxide layer. A capping polysilicon layer 11 is deposited immediately after growth of oxide 15. To prevent oxidation of polysilicon layer 11 during subsequent processing steps, a layer of silicon nitride 12 is deposited over layer 11.

After nitride layer 12 has been deposited, photoresist layer 13 is deposited, then masked, exposed and developed in that order. Nitride layer 12 and polysilicon layer 11 are then etched using standard methods. The result is the oxide/poly/nitride stack shown in FIG. 2 comprising layers 15, 11, and 12, respectively.

With the oxide/poly/nitride stack in place, the source and drain regions are formed by ion implantation into substrate 20. In the currently preferred embodiment, arsenic is first implanted to a level of approximately $1.0-5.0 \times 10^{15}$ cm$^2$ in the source and drain regions. An additional dose of phosphorous to a level of approximately $0.5-2.0 \times 10^{15}$ cm$^2$ is normally implanted into the source region of the device. Since phosphorous dopant diffuses more quickly into the silicon than does arsenic, this makes the source region deeper and more graded when compared to the drain region. As is appreciated by practitioners in the art, this is often desirable for optimum program/erase performance.

Referring now to FIG. 3, following the arsenic and phosphorous implant steps, relatively thick field (SATO) oxide regions 22 are grown aligned over the doped source/drain regions. During the high temperature processing used to form field oxide regions 22, the arsenic and phosphorous dopants are driven into substrate 20 to form source and drain regions 23 and 24, respectively. Note that in the prior art process, this drive is performed before pad oxide removal. FIG. 3 also shows how source region 23 is more graded and deeper when compared to drain region 24, due to the additional phosphorous implant.

Section 25 of tunnel oxide 15, which is disposed between polysilicon layer 11 and source region 23, is where electron transfer (i.e., tunnelling) occurs during electrical erase. It is the thickness of section 25 that is critical to the erase performance of the memory cell.

Referring now to FIG. 4, a cross-sectional view of the substrate of FIG. 3 is shown following removal of silicon nitride layer 12. Poly 1 layer 11 is preferably on the order of 500 Å thick. Depositing a relatively thin polysilicon layer 11 permits a threshold voltage adjusting boron implant to be performed at this point in the process. Alternatively, the boron implant may be applied earlier in the process; for instance, before tunnel oxide growth. Note that by immediately depositing a capping layer of polysilicon following growth of oxide 15, the thickness of oxide 15 is uniformly maintained across the channel as well as in section 25.

After silicon nitride layer 12 has been removed, a second layer of polysilicon 28 is deposited over first polysilicon layer 11. This second polysilicon layer 28 actually merges with first polysilicon layer 11 and together they form the gate of the device. Layer 28 is preferably defined in an identical manner to first polysilicon layer 38 of the '424 patent. In certain circumstances, polysilicon layer 28 may overlap SATO regions 22, as shown in FIG. 5. to provide additional coupling to the control gate word line. This is often important for good program/erase performance.

Following the definition of poly 2 layer 28, the remaining processing steps may be completed utilizing conventional techniques. That is, an interpoly dielectric would next be formed over the layer 28, followed by another polysilicon deposition. This final poly layer forms the control gate for the device. Passivation layers and contacts may then be formed in an ordinary manner to complete the memory.

It is appreciated by practitioners in the art, that by first growing the tunnel oxide and then immediately covering it with a protective polysilicon layer, the tunnel oxide thickness over tunnelling region 25 is carefully controlled. This represents an improvement over prior art processing techniques wherein tunnel oxide is grown over a SATO or LOCOS edge which is highly stressed and can induce gate oxide defects. The pad oxide/silicon nitride stack of the prior art LOCOS process also gives rise to increased photolithographic sensitivity. Unlike silicon nitride, polysilicon absorbs rather than transmits light. This absorption property reduces interference effects in the present invention, thereby permitting better line width control.

It should also be mentioned that in addition to providing a more uniform tunnel oxide thickness, especially in section 25, the present invention also enhances the quality, and therefore the reliability, of the grown oxide. It accomplishes this by growing the oxide on planar silicon with no LOCOS edge and also by protecting oxide 15 from defect-causing contaminants present throughout the remaining processing steps.

With reference once again to FIG. 5, in the currently preferred embodiment, the total thickness of polysilicon layers 11 and 28 is approximately 1200–2000 Å thick. Protective polysilicon layer 11 generally ranges between 200–700 Å thick. Using a relatively thin polysilicon layer adequately protects the oxide 15 from contaminants that could degrade the gate oxide defect density while providing a thin "implant-transparent" layer for added flexibility in subsequent processing steps.

Although it is preferred that tunnel oxide 15 be capped immediately after its growth, it is appreciated that in other embodiments of the present invention poly layer 11 may be deposited following other processing steps. By way of example, the threshold adjusting implant may be done immediately after tunnel oxide growth has been completed. Therefore, it is to be understood that the particular embodiments shown and described by way of illustration are in no way intended to be considered limiting. Reference to the details of the preferred embodiment is not intended to limit the scope of the claims which themselves recite only those features regarded as essential to the invention.

Thus, a method for fabricating floating gate memory arrays with improved electrical erase characteristics and a reduced gate oxide defect density has been described.

What is claimed is:

1. In a process for fabricating an array of floating gate memory devices which are erased by Fowler-Nordheim tunnelling of electrons from a floating gate to a silicon substrate, a method of improving the erase performance of said devices comprises the steps of:
   defining regions in said substrate for field oxide regions and a tunnel oxide region, wherein said tunnel oxide region is between said field oxide regions;
   thermally growing a tunnel oxide layer over said substrate in said tunnel oxide region;
   immediately depositing a first layer of polysilicon on said tunnel oxide layer to inhibit increased oxidation of said tunnel oxide layer within said tunnel oxide region adjacent to said field oxide regions;
   depositing a masking layer over said first polysilicon layer;
   patterning said masking layer to form exposed and unexposed regions of said first polysilicon layer;
   etching said exposed regions of said first polysilicon layer to form said floating gate of said device, thereby leaving said unexposed regions including a portion of said tunnel oxide layer and a portion of said first polysilicon layer that permanently remain over said substrate;
   after depositing said first polysilicon layer, forming source and drain regions within said substrate; and
   after depositing said masking layer, forming field oxide regions in said substrate.

2. The method of claim 1 further comprising the step of removing said masking layer.

3. The process in claim 2 further comprising, after said removing step, the step of depositing a second layer of polysilicon over said first polysilicon layer, making electrical contact thereto, wherein the floating gate of said devices are created.

4. The process of claim 3 wherein the thickness of said first polysilicon layer is greater than the thickness of said tunnel oxide and said first polysilicon layer is relatively thin when compared to said second polysilicon layer.

5. The method of claim 4 wherein said first polysilicon layer has a thickness in the range of about 200–700 Å.

6. The method of claim 5 wherein said first and second polysilicon layers form one continuous layer of polysilicon.

7. The method of claim 1 wherein said masking layer comprises silicon nitride.

8. The method of claim 6 wherein said source and drain regions are formed by ion implantation self-aligned to said gate.

9. The method of claim 8 wherein said tunnel oxide has a thickness in the range of approximately 80–200 Å.

10. The method of claim 2 further comprising, after said removing step, the step of depositing a second layer of polysilicon over said first polysilicon layer, such that one continuous polysilicon layer is formed creating the floating gate of said memory device.

11. The process of claim 10 wherein the thickness of said first polysilicon layer is greater than the thickness of said tunnel oxide and said first polysilicon layer is relatively thin when compared to said second layer polysilicon layer.

12. The method of claim 10 wherein said first polysilicon layer has a thickness in the range of about of 200–700 Å.

13. In a process for fabricating a field-effect device in a silicon substrate, a method of reducing the defect density in a thin gate oxide layer comprising the steps of:
    defining regions in said substrate for field oxide regions and a gate oxide region, wherein said gate oxide region is between said field oxide regions;
    thermally growing a gate oxide layer over said substrate in said gate oxide region;
    immediately capping said gate oxide layer with a first layer of polysilicon to protect it from contaminants which adversely affect said defect density of said gate oxide layer;
    depositing a masking layer over said first polysilicon layer;
    patterning said masking layer to form exposed and unexposed regions of said first polysilicon layer;
    etching said exposed regions of said first polysilicon layer, thereby leaving said unexposed regions including a portion of said gate oxide layer and a portion of said first polysilicon layer that permanently remain over said substrate;
    after depositing said masking layer, forming field oxide regions in said substrate;
    after depositing said first polysilicon layer, forming source and drain regions within said substrate; and
    removing said masking layer.

14. The method of claim 13 further comprising the step of depositing a second layer of polysilicon over said first polysilicon layer, making electrical contact thereto.

15. The method of claim 13 wherein the thickness of said first polysilicon layer is greater than the thickness of said gate oxide and said first polysilicon layer is relatively thin when compared to said second polysilicon layer.

16. The method of claim 15 wherein said first polysilicon layer has a thickness in the range of about 200–700 Å.

17. The method of claim 16 wherein said first and second polysilicon layers form one continuous layer of polysilicon.

18. The method of claim 17 wherein said masking layer comprises silicon nitride.

19. The method of claim 18 wherein said source and drain regions are formed by ion implantation self-aligned to said gate.

20. The method of claim 19 wherein said gate oxide has a thickness in the range of approximately 80–200 Å.

21. In a process for fabricating an array of floating gate memory devices which are erased by Fowler-Nordheim tunnelling of electrons from a floating gate to a silicon substrate, a method of improving the erase performance of said devices comprises the steps of:
    defining regions in said substrate for field oxide regions and a tunnel oxide region, wherein said tunnel oxide region is between said field oxide regions;
    thermally growing a tunnel oxide layer over said substrate in said tunnel oxide region;
    immediately depositing a first layer of polysilicon to inhibit increased oxidation in those areas of said tunnel oxide region adjacent to said field oxide regions, the thickness of said first polysilicon layer being greater than the thickness of said tunnel oxide layer, said first polysilicon layer being relatively thin when compared to said second polysilicon layer, said first polysilicon layer having a thickness in the range of about 200–700 Å;
    depositing a masking layer over said first polysilicon layer;
    patterning said masking layer to form exposed and unexposed regions of said first polysilicon layer;
    etching said exposed regions of said first polysilicon layer and the underlying tunnel oxide layer to form said floating gate of said device;
    forming source and drain regions within said substrate;
    forming field oxide regions in said substrate;
    removing said masking layer; and
    depositing a second layer of polysilicon over said first polysilicon layer, making electrical contact thereto, wherein the floating gate of said devices are created.

22. The method of claim 21 wherein said first and second polysilicon layers form one continuous layer of polysilicon.

23. The method of claim 21 wherein said masking layer comprises silicon nitride.

24. The method of claim 22 wherein said source and drain regions are formed by ion implantation self-aligned to said gate.

25. The method of claim 24 wherein said tunnel oxide has a thickness in the range of approximately 80–200 Å.

26. A process for fabricating on a silicon substrate a floating gate memory device having enhanced erase performance characteristics, said floating gate device being of the type which relies upon Fowler-Nordheim tunnelling of electrons from the floating gate to said substrate comprising the steps of:
    defining regions in said substrate for field oxide regions and a tunnel oxide region, wherein said tunnel oxide region is between said field oxide regions;
    growing a tunnel oxide layer over said substrate;
    immediately depositing a first layer of polysilicon over said tunnel oxide layer to inhibit increased oxidation in those areas of said tunnel oxide region adjacent to said field oxide regions, said first polysilicon layer being a thickness in the range of about 200–700 Å;
    depositing a masking layer over said first polysilicon layer;

patterning said masking layer to form exposed and unexposed regions of said first polysilicon layer;

etching said exposed regions of said polysilicon layer and the underlying tunnel oxide layer to form said floating gate of said device;

forming field oxide regions in said substrate;

forming source and drain regions in said substrate;

removing said making layer; and after said removing step, depositing a second layer of polysilicon over said first polysilicon layer, such that one continuous polysilicon layer is formed creating the floating gate of said memory device.

27. The process of claim 26 wherein the thickness of said first polysilicon layer is greater than the thickness of said tunnel oxide and said first polysilicon layer is relatively thin when compared to said second layer polysilicon layer.

28. In a process for fabricating field-effect devices in a silicon substrate, a method of reducing the defect density in thin gate oxides comprising the steps of:

defining regions in said substrate for field oxide regions and a gate oxide region, wherein said gate oxide region is between said field oxide regions;

thermally growing a gate oxide layer over said substrate in said gate oxide region;

immediately capping said gate oxide layer with a first layer of polysilicon to protect it from contaminants which adversely affect said defect density of said gate oxide, the thickness of said first polysilicon layer being greater than the thickness of said gate oxide layer and said first polysilicon layer being relatively thin when compared to said second polysilicon layer, said first polysilicon layer having a thickness in the range of about 200-700 Å;

forming source and drain regions within said substrate; and depositing a second layer of polysilicon over said first polysilicon layer, making electrical contact thereto.

29. The method of claim 28 wherein said first and second polysilicon layers form one continuous layer of polysilicon.

30. The method of claim 29 wherein said masking layer comprises silicon nitride.

31. The method of claim 30 wherein said source and drain regions are formed by ion implantation self-aligned to said gate.

32. The method of claim 31 wherein said gate oxide has a thickness in the range of approximately 80-200 Å.

* * * * *

UNITED STATES PATENT AND TRADEMARK OFFICE
CERTIFICATE OF CORRECTION

PATENT NO. : 5,106,772
DATED : April 21, 1992
INVENTOR(S) : Lai

It is certified that error appears in the above-identified patent and that said Letters Patent is hereby corrected as shown below:

Col. 3, line 30, delete "conactless" and insert -- contactless --.

Col. 4, line 56, after " in " insert -- both --.

Signed and Sealed this

Thirteenth Day of December, 1994

Attest:

BRUCE LEHMAN

*Attesting Officer*  *Commissioner of Patents and Trademarks*